(12) United States Patent
Kim et al.

(10) Patent No.: US 7,042,001 B2
(45) Date of Patent: May 9, 2006

(54) PHASE CHANGE MEMORY DEVICES INCLUDING MEMORY ELEMENTS HAVING VARIABLE CROSS-SECTIONAL AREAS

(75) Inventors: Young-tae Kim, Gyeonggi-do (KR); Young-nam Hwang, Gyeonggi-do (KR); Tai-kyung Kim, Gyeonggi-do (KR); Won-young Chung, Gyeonggi-do (KR); Keun-ho Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/017,594

(22) Filed: Dec. 20, 2004

(65) Prior Publication Data

US 2005/0167645 A1     Aug. 4, 2005

(30) Foreign Application Priority Data

Jan. 29, 2004  (KR)  ............... 10-2004-0005649

(51) Int. Cl.
*H01L 47/00* (2006.01)
*H01L 29/04* (2006.01)

(52) U.S. Cl. ............ 257/3; 257/4; 257/2; 257/E45.002
(58) Field of Classification Search ............... None
See application file for complete search history.

(56) References Cited

U.S. PATENT DOCUMENTS

| 5,789,758 | A | 8/1998 | Reinberg |
| 5,933,365 | A | 8/1999 | Klersy et al. |
| 6,495,395 | B1 | 12/2002 | Reinberg |
| 6,548,397 | B1 | 4/2003 | Reinberg |
| 6,586,761 | B1 | 7/2003 | Lowrey |
| 6,635,951 | B1 | 10/2003 | Zahorik |
| 6,787,390 | B1 | 9/2004 | Reinberg |
| 2003/0047762 | A1* | 3/2003 | Lowrey ............... 257/276 |
| 2005/0029503 | A1* | 2/2005 | Johnson ............... 257/4 |

FOREIGN PATENT DOCUMENTS

| JP | 4045585 | 2/1992 |
| WO | WO 03/023875 | 3/2003 |

OTHER PUBLICATIONS

Stefan Lai and Tyler Lowrey, "OUM—A 180 nm Non-Volatile Memory Cell Element Technology For Stand Alone and Embedded Applications," 2001 International Electron Devices Meeting, Dec. 5, 2001, Ftpi//download.intel.com/research/silicon/oum_pres.pdf.

(Continued)

*Primary Examiner*—David Nelms
*Assistant Examiner*—Tu-Tu Ho
(74) *Attorney, Agent, or Firm*—Myers Bigel Sibley & Sajovec

(57) ABSTRACT

A phase-change memory device may include first and second spaced apart conductive electrodes, and a phase-change memory element coupled between the first and second conductive electrodes. More particularly, a first portion of the phase-change memory element may have a first cross-sectional area along a current path between the first and second conductive electrodes, and a second portion of the phase-change memory element may have a second cross-sectional area along the current path between the first and second conductive electrodes. Moreover, the first and second cross-sectional areas may be different.

19 Claims, 3 Drawing Sheets

OTHER PUBLICATIONS

Stefan Lai and Tyler Lowrey; "OUM—A 180 nm Non-Volatile Memory Cell Element Technology For Stand Alone and Embedded Applications," 2001 International Electron Devices Meeting 01-803 IEEE pp. 36.5.1-36.5.4.

Notice to Submit a Response for Korean Patent Application No. 10-2004-0005649 mailed on Nov. 28, 2005.

English Translation of Notice to Submit a Response for Korean Patent Application No. 10-2004-0005649 mailed on Nov. 28 2005.

* cited by examiner

PHASE CHANGE MEMORY DEVICES INCLUDING MEMORY ELEMENTS HAVING VARIABLE CROSS-SECTIONAL AREAS

RELATED APPLICATION

This application claims the benefit of and priority under 35 U.S.C. §119 to Korean Patent Application No. 2004-5649, filed on Jan. 29, 2004, in the Korean Intellectual Property Office, the disclosure of which is incorporated herein in its entirety by reference.

FIELD OF THE INVENTION

The present invention relates to memory devices, and more particularly, to phase-change random access memory (PRAM) devices.

BACKGROUND

A phase-change random access memory (PRAM) device uses a change in an electric resistance according to a crystalline phase of a phase-change material, such as a chalcogenide material. At least a portion of a phase-change chalcogenide material layer changes into either a crystalline or an amorphous state according to a profile of an electric current passed through the chalcogenide material. The crystalline phase of the phase-change material layer, for example, can be selectively changed by altering the temperature. In other words, at least a portion of the phase-change material layer in the crystalline state may be changed by altering the temperature by controlling the profile of an electric current passed through the phase-change material layer. For example, the phase-change material layer may be transformed into the amorphous state, having a relatively high electrical resistance (i.e., a RESET state) when the phase-change material layer is rapidly cooled after applying a relatively high current pulse in a short period of time to increase the temperature of the phase-change material layer to its melting point. The phase-change material layer may be transformed into a crystalline state, having a relatively low electrical resistance (i.e., a SET state) when the phase-change material layer is cooled after applying a relatively low current pulse.

For phase-change memory devices, an important factor in decreasing energy usage during operation and increasing reliability may be reducing an amount of current used to change a state of the phase-change material layer. Accordingly, there have been attempts to increase efficiency of joule heating by reducing a contact area between the phase-change material layer and a contact plug.

A conventional phase-memory device may include a bottom electrode, a phase-change material layer, and a top electrode, in a vertical contact structure with the bottom electrode, the phase-change material layer, and the top electrode being sequentially vertically connected. (For example, refer to Stefan Lai and Tyler Lowrey "*OUM-A 180 nm Nonvolatile Memory Cell Element Technology For Standard Alone and Embedded Applications,* IEDM Tech Dig., 2001.) In such a structure, a current density at the two contacting areas may increase rapidly by reducing a contact area between the phase-change material layer and the electrode to thereby increase joule heating.

A conventional phase-change memory device may have a structure with a phase-change material layer extending in a plane between bottom and top electrodes. Significant heat loss may thus result.

SUMMARY

According to embodiments of the present invention, a phase-change memory device may include first and second spaced apart conductive electrodes, and a phase-change memory element coupled between the first and second conductive electrodes. A first portion of the phase-change memory element may have a first cross-sectional area along a current path between the first and second conductive electrodes, and a second portion of the phase-change memory element may have a second cross-sectional area along the current path between the first and second conductive electrodes. Moreover, the first and second cross-sectional areas may be different. More particularly, the first and second cross-sectional areas may be perpendicular with respect to the current path between the first and second conductive electrodes.

The phase-change memory device may also include a semiconductor substrate with the first and second conductive electrodes being spaced apart in a direction parallel to a surface of the semiconductor substrate. In addition, an insulating layer may be provided on the semiconductor substrate between the first and second conductive electrodes with the phase-change memory element being on the insulating layer, and the insulating layer may be between the phase-change memory layer and the semiconductor substrate. More particularly, the first portion of the phase-change memory element may be parallel to the surface of the semiconductor substrate, and the second portion of the phase-change memory element may be non-parallel with respect to the surface of the substrate. The second portion of the phase-change memory element may be provided at an acute angle with respect to the surface of the semiconductor substrate, or the second portion of the phase-change memory element may be substantially orthogonal with respect to the semiconductor substrate. Moreover, the first cross-sectional area of the first portion of the phase-change memory element may be greater than the second cross-sectional area of the second portion of the phase-change memory element.

In addition, the phase-change memory element may include third, fourth, and fifth portions. The third portion may be parallel to the surface of the semiconductor substrate such that the second portion is connected between the first and third portions. The fourth portion may be non-parallel with respect to the surface of the semiconductor such that the third portion is connected between the second and fourth portions. The fifth portion may be parallel to the surface of the semiconductor substrate such that the fourth portion is connected between the third and fifth portions. More particularly, the third portion of the phase-change memory element may be a greater distance from the surface of the semiconductor substrate than either of the first and fifth portions of the phase-change memory element.

In an alternative, the phase-change memory device may include a semiconductor substrate with the first conductive electrode being on the semiconductor substrate between the phase-change memory element and the semiconductor substrate. In addition to the elements discussed above, the phase-change memory device may include a transistor having a control electrode and an input/output electrode with the input/output electrode being electrically coupled to the first conductive electrode.

The phase-change memory element may include a phase-change material including a chalcogen element. For example, the phase-change material may include at least one of Te, Se, Ge, Sb, Bi, Pb, Sn, As, S, Si, P, and/or O. More particularly, the phase-change material may include Ge, Sb, and Te, or the phase-change material may include In, Sb, Te, and Ag. Each of the first and second conductive electrodes may comprise at least one of a metal, an alloy, a metallic oxide, a metallic nitride, and/or a conductive carbon compound. More particularly, each of the first and second conductive electrodes may comprise at least one of W, TiN, TaN, WN, MoN, NbN, TiSiN, TiAlN, TiBN, ZrSiN, WSiN, WBN, ZrAlN, MoSiN, MoAlN, TaSiN, TaAlN, Ti, W, Mo, Ta, TiSi, TaSi, TiW, TiON, TiAlON, WON, and/or TaON.

The phase-change memory element may also include a third portion having the first cross-sectional area along the current path between the first and second conductive electrodes wherein the second portion is connected between the first and third portions. The first cross-sectional area may be less than the second cross-sectional area. In an alternative, the first cross-sectional area may be greater than the second cross-sectional area.

Some embodiments of the present invention may provide phase-change memory devices that have a structure with a reduced contact area between a bottom electrode and a phase-change material layer so that an electric current used to transform the phase-change material layer into a RESET state can be reduced and an efficiency of joule heating can be increased. Current density during programming may thus be increased.

According to some embodiments of the present invention, a phase-change memory device may include: a first conductive layer formed on the semiconductor substrate; a second conductive layer formed on the semiconductor substrate spaced apart from the first conductive layer; and a phase-change memory layer extending between the first and second conductive layers. The phase-change memory layer may have a cross-sectional area that varies along a path of an electric current between the first and second conductive layers.

According to other embodiments of the present invention, the first and second conductive layers may both be formed at a same distance from the semiconductor substrate, and may be spaced apart from each other in a direction parallel to the direction in which a main surface of the semiconductor substrate extends. The distance between the phase-change memory layer and the semiconductor substrate may vary along a path of an electric current between the first and second conductive layers. In addition, the phase-change memory layer may have a stepped position at which a distance between the phase-change memory layer and the semiconductor substrate varies. Also, the phase-change memory layer may include a first portion that extends in the direction parallel to the direction in which the main surface of the semiconductor substrate extends and that has a first cross-sectional area, and a second portion that extends in a direction non-parallel to the direction in which the main surface of the semiconductor substrate extends and that has a second cross-sectional area that is less than the first cross-sectional area. The phase-change memory layer may have a structure in which the first and second portions alternate.

The second portion may extend in a direction that is inclined at an acute angle to the direction in which the main surface of the semiconductor substrate extends or in a direction perpendicular to the direction in which the main surface of the semiconductor substrate extends.

According to yet other embodiments of the present invention, the first and second conductive layers may be formed at different distances from the semiconductor substrate, and spaced apart from each other in a direction perpendicular to the direction in which the main surface of the semiconductor substrate extends. The width of the phase-change memory layer may vary along a path of an electric current between the first and second conductive layers. Also, the phase-change memory layer may have a width variation portion at which the width of the phase-change memory layer varies. In addition, the phase-change memory layer may include a first portion having a first width in the direction parallel to the direction in which the main surface of the semiconductor substrate extends, and a second portion having a second width, which is smaller than the first width, in a direction parallel to the direction in which the main surface of the semiconductor substrate extends.

The phase-change memory layer may include a phase-change material including a chalcogen element. The phase-change memory may include a combination of Ge, Sb, and/or Te and/or a combination of In, Sb, Te, and/or Ag.

According to yet other embodiments of the present invention, an amount of current used by a transistor for programming may be reduced. Reliability of phase-change memory devices according to embodiments of the present invention may thus be improved.

DETAILED DESCRIPTION

Figure 1:
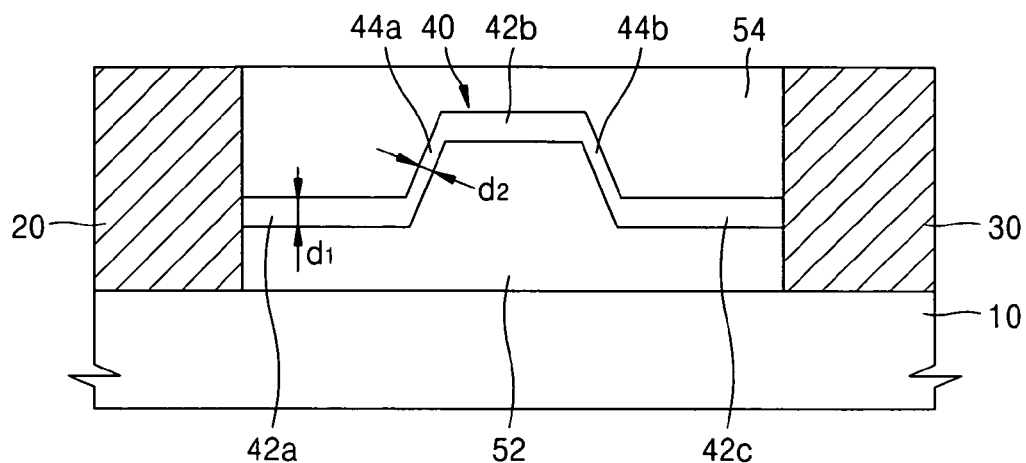
FIG. 1 is a cross-sectional view of a phase-change memory device according to first embodiments of the present invention.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

In the drawings the thickness of layers and regions are exaggerated for clarity. It will also be understood that when an element such as a layer, region or substrate is referred to as being on another element, it can be directly on the other element or intervening elements may also be present. In contrast, if an element such as a layer, region or substrate is referred to as being directly on another element, then no other intervening elements are present. As used herein, the term and/or includes any and all combinations of one or more of the associated listed items.

Furthermore, relative terms, such as beneath, upper, and/or lower may be used herein to describe one element's relationship to another element as illustrated in the figures. It will be understood that relative terms are intended to encompass different orientations of the device in addition to the orientation depicted in the figures. For example, if the device in one of the figures is turned over, elements described as below other elements would then be oriented above the other elements. The exemplary term below can, therefore, encompasses both an orientation of above and below; the exemplary term lower can, therefore, encompass both an orientation of lower and upper; and the exemplary term upper can, therefore, encompass both an orientation of upper and lower.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section could be termed a first region, layer or section without departing from the teachings of the present invention. Like numbers refer to like elements throughout.

The terminology used herein is for the purpose of describing particular embodiments only and is not intended to be limiting of the invention.. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the precise shape of a region of a device and are not intended to limit the scope of the present invention.

FIG. 1 is a cross-sectional view of a phase-change memory device according to first embodiments of the present invention. Referring to FIG. 1, the phase-change memory device includes a bottom electrode, including a first conductive layer 20 and a second conductive layer 30. The first and second conductive layers 20 and 30 may be formed on semiconductor substrate 10, and the first and second conductive layers 20 and 30 may be separated by a distance along a direction parallel to a surface of the substrate 10. A phase-change memory layer 40 extends between the first and second conductive layers 20 and 30. The phase-change memory layer 40 provides a variable cross-sectional area along a path of electric current between the first and second conductive layers 20 and 30.

The first and second conductive layers 20 and 30 may be formed on a same level separated from the semiconductor substrate 10 and may be separated in a direction parallel to a direction in which the main surface of the semiconductor substrate 10 extends.

Each of the first and second conductive layers 20 and 30 may include a metal, an alloy, a metallic oxide and nitride, and/or a conductive carbon compound. For example, the first and second conductive layers 20 and 30 may each include W, TiN, TaN, WN, MoN, NbN, TiSiN, TiAlN, TiBN, ZrSiN, WSiN, WBN, ZrAlN, MoSiN, MoAlN, TaSiN, TaAlN, Ti, W, Mo, Ta, TiSi, TaSi, TiW, TiON, TiAlON, WON, and/or TaON. For example, each of the first and second conductive layers 20 and 30 may be a layer of TiN.

The phase-change memory layer 40 may be formed between first and second insulation layers 52 and 54 on the substrate between the first and second conductive layers 20 and 30. Also, a distance between the phase-change memory layer 40 and the semiconductor substrate 10 may vary along a path of current between the first and second conductive layers 20 and 30 on the first insulation layer 52.

The phase-change memory layer 40 may be a layer of a phase-change material including a chalcogen element. For example, the phase-change memory layer 40 may be a layer of a material including one or more of Te, Se, Ge, Sb, Bi, Pb, Sn, As, S, Si, P, and/or O, and/or combinations and/or alloys thereof. The phase-change memory layer 40 may be a layer of a material including a combination of Ge, Sb, and Te and/or a layer of a material including a combination of In, Sb, Te and Ag.

The phase-change memory layer 40 may include first portions 42*a–c* extending in a direction parallel to a surface of the semiconductor substrate 10 and having a first cross-sectional area; and second portion 44*a–b* extending in a direction non-parallel to the surface of the semiconductor substrate 10 and having a second cross-sectional area that is less than the first cross-sectional area. In other words, a thickness $d_2$ of the second portions 44*a–b* is less than a thickness $d_1$ of the first portions 42*a–c* of the phase-change memory layer 40. Therefore, the second portions 44*a–b* may have a smaller cross-sectional area than the first portions 42*a–c*. More particularly, the first and second cross-sectional areas may be perpendicular with respect to the current path through the phase change memory layer 40 between the first and second conductive electrodes 20 and 30. The first and second cross-sectional areas are thus taken with respect to the thicknesses $d_1$ and $d_2$ and a width of the phase-change memory layer 40 into the page of FIGS. 1 and 2.

In FIG. 1, the second portions 44*a–b* may extend in directions that are inclined at an acute angle relative to the surface of the semiconductor substrate 10. Through having such a structure, the second portions 44*a–b* of the phase-change memory layer 40 may have a stepped portion having a distance from the semiconductor substrate 10 that varies. The phase-change memory layer 40 has a structure in which the first and second portions 42*a–c* and 44*a–b* alternate.

Figure 2:
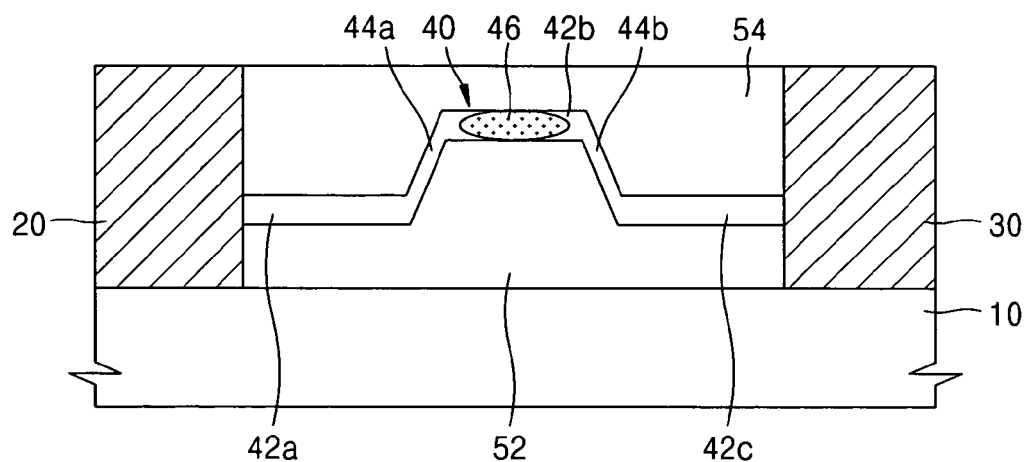
FIG. 2 is a cross-sectional view of the phase-change memory device of FIG. 1 after a current is applied to a phase-change memory layer of the phase-change memory device.

FIG. 2 is a cross-sectional view of the phase-change memory device of FIG. 1 after applying a current to the phase-change memory layer 40. Referring to FIG. 2, the first portion 42b of the phase-change memory layer 40 is distanced further away from both of the first and second electrodes 20 and 30 than other portions of the phase-change memory layer 40, and the first portion 42b is distanced further away from the substrate 10 than other portions of the phase change memory layer 40 due to the stepped portion of the second portion 44. Since a heat core region of the phase-change portion 46 may be produced in the part of the first portion 42b distanced further away from the first and second electrodes 20 and 30, (which may comprise conductive materials with relatively high thermal conductivity), an effect of confining thermal diffusion may be increased. Therefore, an amount of current from a transistor used for programming can be reduced. More particularly, the transistor may include at least two input/ouput electrodes and a control electrode may be provided in/on the substrate 10, and an input/output electrode of the transistor may be coupled to one of the electrodes 20 or 30. In addition, operation of the memory device may use less current thereby improving a reliability of the memory device.

Figure 3:
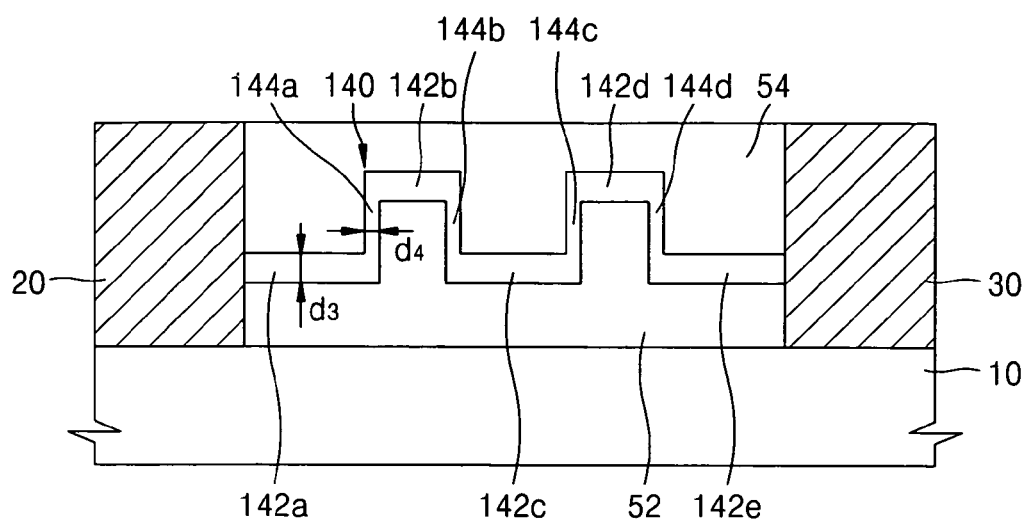
FIG. 3 is a cross-sectional view of a phase-change memory device according to second embodiments of the present invention.

FIG. 3 is a cross-sectional view of a phase-change memory device according to second embodiments of the present invention. The phase-change memory device of FIG. 3 is similar to that of FIG. 1. In FIG. 3, however, second portions 144a–d of a phase-change memory layer 140 may extend substantially perpendicular with respect to the surface of the semiconductor substrate 10 and the second portions 144a–d may include four regions. Like reference numerals in the first and second embodiments denote like elements.

Referring to FIG. 3, the phase-change memory layer 140 may have a first portions 142a–e that extend parallel with respect to the surface of the semiconductor substrate 10, as in the phase-change memory layer 40 of FIG. 1. Second portions 144a–d of the phase-change memory layer 140 may extend perpendicular with respect to the surface of the semiconductor substrate 10. The first portions 142a–e and the second portions 144a–d may be formed on the first insulation layer 52. The phase-change memory layer 140 may include one or more of the same materials discussed above with respect to the phase-change memory layer 40 of FIG. 1. Also, a thickness $d_4$ of the second portions 144a–d may be less than a thickness $d_3$ of the first portions 142a–e of the phase-change memory layer 140. Therefore, the second portions 144a–d may have a smaller cross-sectional area than the first portions 142a–d. More particularly, the cross-sectional areas of the first portions 142a–e and the second portions 144a–d may be perpendicular with respect to the current path through the phase change memory layer 140 between the first and second conductive electrodes 20 and 30. The cross-sectional areas are thus taken with respect to the thicknesses $d_3$ and $d_4$ and a width of the phase-change memory layer 140 into the page of FIGS. 3 and 4.

Figure 4:
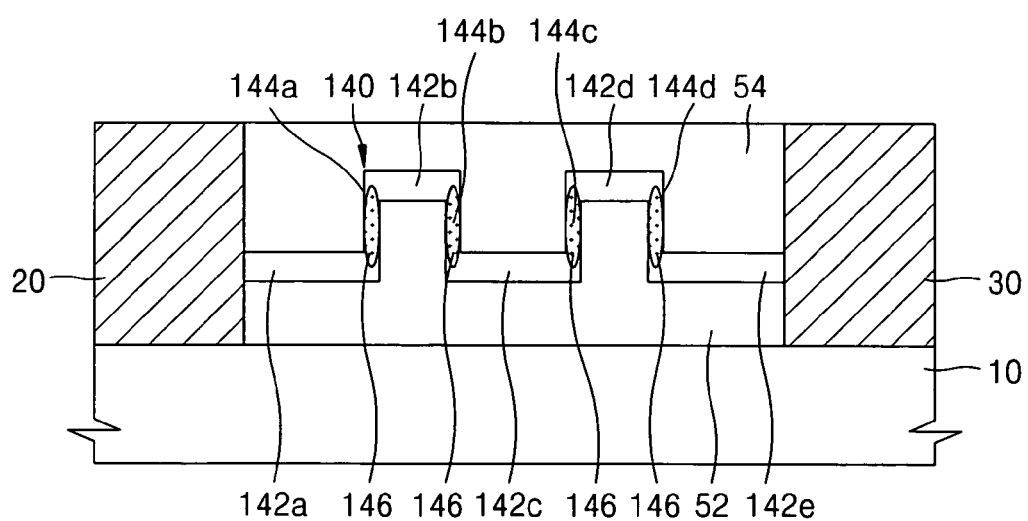
FIG. 4 is a cross-sectional view of the phase-change memory device of FIG.3 after a current is applied to a phase-change memory layer of the phase-change memory device.

FIG. 4 is a cross-sectional view of the phase-change memory device of FIG. 3 after applying a current to the phase-change memory layer 140. Referring to FIG. 4, a number of regions in which phase-change portions 146 of the phase-change memory layer 140 can be formed may increase because regions where the current density is relatively high or low increases by controlling thicknesses at the first and second portions 142a–e and 144a–d. Therefore, an amount of current from a transistor used for programming can be reduced and a sensing margin can be improved because a RESET resistance may be increased when programming. The transistor may include at least two input/ouput electrodes and a control electrode may be provided in/on the substrate 10, and an input/output electrode of the transistor may be coupled to one of the electrodes 20 or 30.

Figure 5:
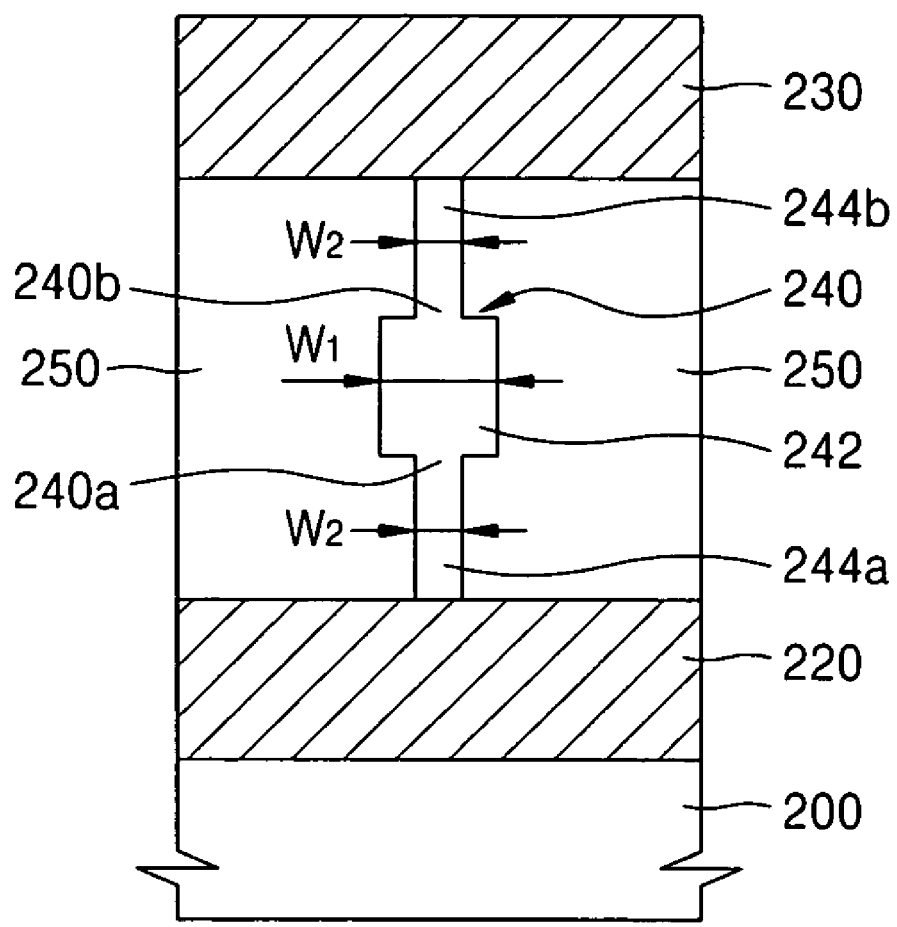
FIG. 5 is a cross-sectional view of a phase-change memory device according to third embodiments of the present invention.

FIG. 5 is a schematic cross-sectional view of a phase-change memory device according to third embodiments of the present invention. The phase-change memory device of FIG. 5 is similar to that of FIG. 1. In FIG. 5, however, a first conductive layer 220, which is a bottom electrode, and a second conductive layer 230, which is a top electrode, may be formed at different levels relative to a substrate 200. The first and second conductive layers 220 and 230 are spaced apart from each other in a direction perpendicular to a surface of the substrate 200.

Referring to FIG. 5, a horizontal width (i.e. parallel to the substrate 200) of a phase-change memory layer 240 may vary along a current path between the first and second conductive layers 220 and 230. The phase-chance memory layer 240 may extend through an insulation layer 250 between the first and second conductive layers 220 and 230.

Each of the first and second conductive layers 220 and 230 may be a layer of a metal, an alloy, a metallic oxide and nitride, and/or a conductive carbon compound. For example, each of the first and second conductive layers 220 and 320 may be a layer of one or more of W, TiN, TaN, WN, MoN, NbN, TiSiN, TiAlN, TiBN, ZrSiN, WSiN, WBN, ZrAlN, MoSiN, MoAlN, TaSiN, TaAlN, Ti, W, Mo, Ta, TiSi, TaSi, TiW, TiON, TiAlON, WON, and/or TaON. For example, each of the first and second conductive layers 220 and 230 may be a layer of of TiN.

The phase-change memory layer 240 may be a layer of a phase-change material including a chalcogen element. For example, the phase-change memory layer 240 may be a layer of a phase-change material including Te, Se, Ge, Sb, Bi, Pb, Sn, As, S, Si, P, and/or O, and/or combinations and/or alloys thereof. The phase-change memory layer 240 may be a layer of a material including a combination of Ge, Sb, and Te and/or a combination of In, Sb, Te and Ag.

The phase-change memory layer 240 may include a first portion 242 having a first width $W_1$ and second portions 244a–b having a second width $W_2$. The second width $W_2$ may be less than the first width $W_1$. Therefore, the second portions 244a–b of the phase-change memory layer 240 may have smaller cross-sectional areas than the first portion 242 between the second portions 244a–b. More particularly, the cross-sectional areas of the first portion 242 and the second portions 244a–b may be perpendicular with respect to the current path through the phase change memory layer 240 between the first and second conductive electrodes 220 and 230. The cross-sectional areas of the first portion 242 and the second portions 244a–b are thus taken with respect to the widths $w_1$ and $w_2$ and a width of the phase-change memory layer 240 into the page of FIG. 5.

In FIG. 5, the phase-change memory layer 240 has a structure in which the first portion 242 and the second portions 244a–b alternate and width variation portions 240a and 240b are provided at interfaces between the first and second portions 242 and 244a–b. At the width variation portions 240a and 240b there may be a relatively high current density and relatively little heat loss. Therefore, when current is applied to the phase-change memory layer 240, phase-change portions (not shown) may be formed at the width variation portions 240a and 240b of the phase-change memory layer 240.

As illustrated in FIG. 5, a number of regions where the phase-change portions are formed may increase in the phase-change memory layer 240 because regions where the current density is relatively high or low may increase at a plurality of regions of the phase-change memory layer 240 by controlling the width at the first portions 242 and at the second portions 244*a–b*. Therefore, an amount of current from a transistor used for programming may be reduced and a sensing margin may be improved because a RESET resistance may be increased when programming. The transistor may include at least two input/ouput electrodes and a control electrode may be provided in/on the substrate 200, and an input/output electrode of the transistor may be coupled to one of the electrodes 220 or 230.

A phase-change memory device according to embodiments of the present invention may include a phase-change memory layer extending along a path of a current between two electrodes. The phase-change memory layer may include a plurality of parts or segments having different cross-sectional areas. Since the cross-sectional areas of the plurality of parts or segments of the phase-change memory layer vary, current densities in the phase-change layer may also vary, thereby increasing a number of phase-change regions. In addition, since a heat core region of the phase-change portion of the phase-change memory layer may be spaced by a greater distance from the electrodes, confinement of thermal diffusion occurring at the phase-change portions can be increased or thermal diffusion at the phase-change portion(s) can be reduced. Therefore, an amount of current from a transistor used for programming may be reduced and, as a result, a phase-change memory device with an improved sensing margin can be achieved when programming.

While the present invention has been particularly shown and described with reference to embodiments thereof, it will be understood by those skilled in the art that various changes in form and details may be made therein without departing from the spirit and scope of the invention as defined by the appended claims and their equivalents.

What is claimed is:

1. A phase-change memory device comprising:
    first and second spaced apart conductive electrodes;
    a phase-change memory element coupled between the first and second conductive electrodes, wherein a first portion of the phase-change memory element has a first cross-sectional area along a current path between the first and second conductive electrodes, wherein a second portion of the phase-change memory element has a second cross-sectional area along the current path between the first and second conductive electrodes, and wherein the first and second cross-sectional areas are different;
    a semiconductor substrate wherein the first and second conductive electrodes are spaced apart in a direction parallel to a surface of the semiconductor substrate; and
    an insulating layer on the semiconductor substrate between the first and second conductive electrodes wherein the phase-change memory element is on the insulating layer and wherein the insulating layer is between the phase-change memory layer and the semiconductor substrate.

2. A phase-change memory device according to claim 1 wherein the first portion of the phase-change memory element is parallel to the surface of the semiconductor substrate and wherein the second portion of the phase-change memory element is non-parallel with respect to the surface of the substrate.

3. A phase-change memory device according to claim 2 wherein the second portion of the phase-change memory element is provided at an acute angle with respect to the surface of the semiconductor substrate.

4. A phase-change memory device according to claim 2 wherein the second portion of the phase-change memory element is substantially orthogonal with respect to the semiconductor substrate.

5. A phase-change memory device according to claim 2 wherein the first cross-sectional area of the first portion of the phase-change memory element is greater than the second cross-sectional area of the second portion of the phase-change memory element.

6. A phase-change memory device according to claim 2 wherein the phase-change memory element further includes
    a third portion parallel to the surface of the semiconductor substrate such that the second portion is connected between the first and third portions,
    a fourth portion non-parallel with respect to the surface of the semiconductor such that the third portion is connected between the second and fourth portions, and
    a fifth portion parallel to the surface of the semiconductor substrate such that the fourth portion is connected between the third and fifth portions.

7. A phase-change memory device according to claim 6 wherein the third portion of the phase-change memory element is a greater distance from the surface of the semiconductor substrate than either of the first and fifth portions of the phase-change memory element.

8. A phase-change memory device comprising:
    first and second spaced apart conductive electrodes; and
    a phase-change memory element coupled between the first and second conductive electrodes, wherein a first portion of the phase-change memory element has a first cross-sectional area along a current path between the first and second conductive electrodes, wherein a second portion of the phase-change memory element has a second cross-sectional area along the current path between the first and second conductive electrodes, and wherein the first and second cross-sectional areas are different;
    wherein the phase-change memory element further comprises a third portion having the first cross-sectional area along the current path between the first and second conductive electrodes wherein the second portion is connected between the first and third portions.

9. A phase-change memory device according to claim 8 wherein the first cross-sectional area is less than the second cross-sectional area.

10. A phase-change memory device according to claim 8 wherein the first cross-sectional area is greater than the second cross-sectional area.

11. A phase-change memory device according to claim 8 wherein the first cross-sectional area is perpendicular to the current path through the first portion of the phase-change memory element and wherein the second cross-sectional area is perpendicular to the current path through the second portion of the phase-change memory element.

12. A phase-change memory device according to claim 8 further comprising:
    a semiconductor substrate wherein the first conductive electrode is on the semiconductor substrate between the phase-change memory element and the semiconductor substrate.

13. A phase-change memory device according to claim 8 further comprising:
    a transistor including a control electrode and an input/output electrode, the input/output electrode being electrically coupled to the first conductive electrode.

14. A phase-change memory device according to claim 8 wherein the phase-change memory element comprises a phase-change material comprising a chalcogen element.

15. A phase-change memory device according to claim 8 wherein the phase-change memory element comprises a phase-change material comprising at least one of Te, Se, Ge, Sb, Bi, Pb, Sn, As, S, Si, P, and/or O.

16. A phase-change memory device according to claim 15 wherein the phase-change material includes Ge, Sb, and Te.

17. A phase-change memory device according to claim 15 wherein the phase-change material includes In, Sb, Te, and Ag.

18. A phase-change memory device according to claim 8 wherein each of the first and second conductive electrodes comprises at least one of a metal, an alloy, a metallic oxide, a metallic nitride, and/or a conductive carbon compound.

19. A phase-change memory device according to claim 8 wherein each of the first and second conductive electrodes comprises at least one of W, TiN, TaN, WN, MoN, NbN, TiSiN, TiAlN, TiBN, ZrSiN, WSiN, WBN, ZrAlN, MoSiN, MoAlN, TaSiN, TaAlN, Ti, W, Mo, Ta, TiSi, TaSi, TiW, TiON, TiAlON, WON, and/or TaON.

* * * * *